United States Patent [19]

Neilson et al.

[11] Patent Number: 5,218,220

[45] Date of Patent: Jun. 8, 1993

[54] POWER FET HAVING REDUCED THRESHOLD VOLTAGE

[75] Inventors: John M. S. Neilson, Norristown; Frederick P. Jones, Mountaintop; Joseph A. Yedinak, Wilkes-Barre, all of Pa.

[73] Assignee: Harris Corporation, Melbourne, Fla.

[21] Appl. No.: 789,901

[22] Filed: Nov. 12, 1991

[51] Int. Cl.[5] .............................................. H01L 29/10
[52] U.S. Cl. .................................... 257/327; 257/335; 257/343; 257/345; 257/657
[58] Field of Search ............... 357/23.4; 257/327, 335, 257/343, 345, 657

[56] References Cited

U.S. PATENT DOCUMENTS 5,055,895 10/1991 Akiyama et al. .................. 357/23.4

Primary Examiner—Edward Wojciechowicz
Attorney, Agent, or Firm—Spensley Horn Jubas & Lubitz

[57] ABSTRACT

In a power FET composed of a substrate having upper and lower surfaces and having a semiconductor body of a first conductivity type, the body providing a current flow path between the upper and lower surfaces and having at least one body region which extends to said upper surface; and at least one base region extending into the substrate from the upper surface, the base region being of a second conductivity type opposite to the first conductivity type and having an upper portion located adjacent the upper surface of the substrate and a lower portion separated from the upper surface of the substrate by the upper portion, the upper portion defining a channel which is disposed in the current flow path adjacent the upper surface of the substrate, and the FET further having an insulated gate disposed at the upper surface above the body region, an impurity layer region extends into the channel from the upper surface of the substrate for giving the channel a lower impurity density than the lower portion of the base region.

6 Claims, 2 Drawing Sheets

POWER FET HAVING REDUCED THRESHOLD VOLTAGE

BACKGROUND OF THE INVENTION

The present invention relates to power transistors of the vertical type, principal examples of which are metal oxide silicon field effect transistors (hereinafter MOSFETs) and insulated gate bipolar transistors (hereinafter IGBTs).

Known devices of this type include those having geometries such that multiple body regions are formed within a large drain area, or a large body region is formed to create multiple drain regions. Structures of the first type are exemplified by those disclosed in U.S. Pat. No. 5,008,725, while structures of the second type are exemplified by those disclosed in U.S. Pat. No. 4,823,176.

FIG. 1 is a cross sectional view of a portion of a MOSFET fabricated in accordance with the prior art. The type of MOSFET to which the invention is particularly to be applied is a power FET which is employed to produce a controlled current flow in a vertical direction between source and drain electrodes disposed at the top and bottom, respectively, of a semiconductor chip.

The MOSFET is constituted by a semiconductor substrate and the illustrated embodiment is an N channel device. It will be appreciated that the invention may be applied to P channel devices.

In the illustrated structure, the substrate has an N− body 2 in which is formed, at the surface 4 of the substrate, at least one P conductivity base region 6. Wherever base region 6 is not present, body 2 extends to surface 4. A PN junction 8 is created between body 2 and base region 6 and the part of base region 6 adjacent both surface 4 and junction 8 constitutes the channel region 10 where switching of the MOSFET is controlled.

Devices of the type here under consideration may have a structure such that a plurality of isolated base regions 6 are formed, by diffusion or implantation, so that the parts of N− body 2 which extend to surface 4 form a continuous matrix, or lattice, or such that a single base region 6 is produced in the form of a matrix or lattice, so that isolated parts of body 2 extend to surface 4. Hereinafter, for the sake of simplicity, region 6 will be referred to in the singular.

With the aid of suitable masking, an N+ emitter, or source, region 12 is formed in base region 6 to define the end of channel region 10 which is remote from junction 8. Region 12 extends along the entire horizontal periphery of junction 8. The central part of base region 6 is doped to have P+ conductivity.

Surface 4 is covered with an insulating layer 14 of SiO₂, polycrystalline silicon gate regions 20 and a Boron Phosphorous Silicon Glass (BPSG) layer 22. Gate regions 20 and BPSG layer 22 are disposed above the locations where body 2 extends to surface 4 and can serve as a mask for diffusion of P conductivity material to form base region 6. In addition, regions 20 and layer 22 extend across channels 10 and terminate on regions 12 so that a source metal layer 24 deposited on layer 22 and the exposed portions of surface 4 will contact regions 12 and the P+ conductivity part of base region 6.

A problem common to known devices of this type is that they contain a parasitic bipolar transistor 26 associated with the, or each, emitter region 12. In such a bipolar transistor, region 12 constitutes the emitter, base region 6 forms the base and region 2 the collector. Such a parasitic bipolar transistor can reduce the ruggedness of a MOSFET in that it will cause the device to undergo a second breakdown when exposed simultaneously to a high current and a high voltage. In an IGBT, the parasitic bipolar transistor forms a four-layer structure which can latch at high currents.

In order to minimize the effect of this parasitic bipolar transistor, base region 6 should be doped as heavily as possible since this will create a corresponding reduction in the gain of the parasitic transistor. In prior art devices, the maximum doping which can be employed is limited primarily by threshold voltage requirements. Because the doping of channel region 10 is produced by lateral diffusion of the dopant forming base region 6, which lateral diffusion occurs beneath the edge of gate layer 20, an increase in the dopant concentration in base region 6 generally results in an increase in dopant concentration in channel 10, accompanied by a higher threshold voltage.

SUMMARY OF THE INVENTION

It is an object of the present invention to reduce the threshold voltage of such transistors while retaining the advantage of minimizing the effect of the parasitic bipolar transistor.

Another object of the invention is to allow the impurity concentration in the base region to be increased in order to further reduce the effects of a parasitic bipolar transistor.

Yet another object of the invention is to reduce the channel resistance of vertical FET transistors.

The above and other objects are achieved, according to the present invention, in a power FET composed of a substrate having upper and lower surfaces and having a semiconductor body of a first conductivity type, the body providing a current flow path between the upper and lower surfaces and having at least one body region which extends to the upper surface, and at least one base region extending into the substrate from the upper surface, the base region being of a second conductivity type opposite to the first conductivity type and having a portion constituting a channel which is disposed in the current flow path adjacent the upper surface of the substrate, and the FET further having an insulated gate disposed at the upper surface above the body region, by the provision of an impurity layer region extending into the channel from the upper surface of the substrate for giving the channel a lower impurity density than portions of the base region which are below the impurity layer region.

DESCRIPTION OF THE PREFERRED EMBODIMENTS

Figure 1:
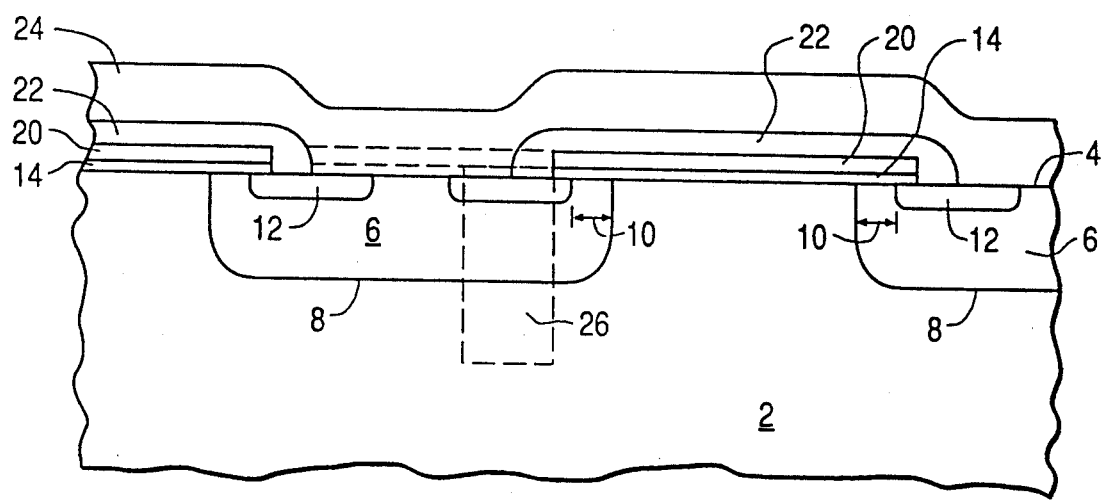
FIG. 1 is a cross-sectional detail view of a portion of an insulated gate power transistor according to the prior art.

In preferred embodiments of the present invention, device characteristics are improved by lowering the impurity concentration, or density, in the channel region 10 of base region 6 which extends laterally between junction 8 and emitter 12, and hence which is located adjacent surface 4. This is done in such a manner as to not reduce the impurity concentration in deeper parts of base region 6, where the higher impurity concentration will suppress the adverse influence of the parasitic bipolar transistor. As a result, the impurity concentration in the deeper parts of base region 6 can be increased compared to those employed in the prior art.

Figure 2:
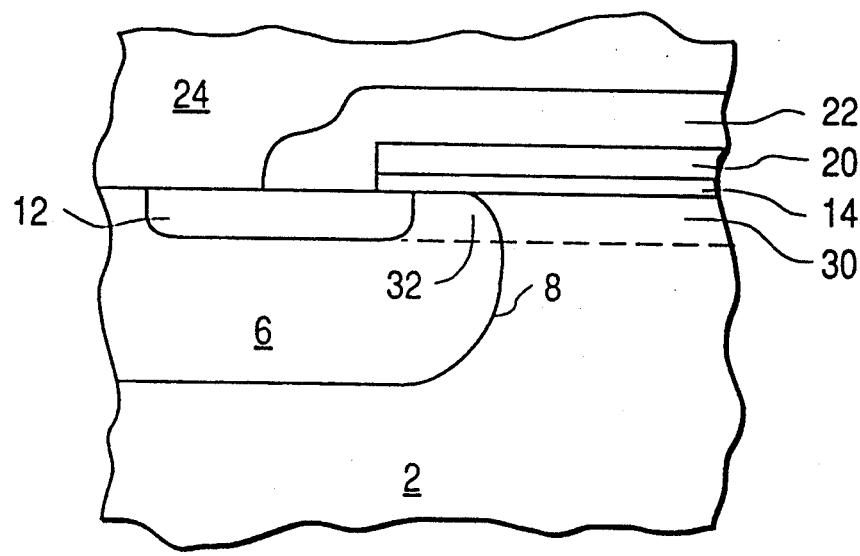

This improvement is achieved, in the embodiment shown in FIG. 2, by implanting an N conductivity impurity into the entire wafer surface as the first fabrication step after forming epitaxial body 2. This implantation creates a shallow impurity layer 30 of N conductivity. To limit the depth of layer 30 as that it remains close to surface 4, the impurity employed is selected to be one which diffuses more slowly than the impurity that will be used to form P conductivity base region 6. With this arrangement, region 32 of layer 30, which corresponds essentially to channel 10, will have a net P conductivity impurity concentration lower than that of the remainder of base region 6.

The embodiment illustrated in FIG. 2 can be produced in a simple manner but is capable only of achieving relatively small threshold adjustments because an excessive amount of N conductivity impurity in body 2 at a location adjacent to base region 6 will also reduce the avalanche breakdown voltage of the device.

Figure 3:
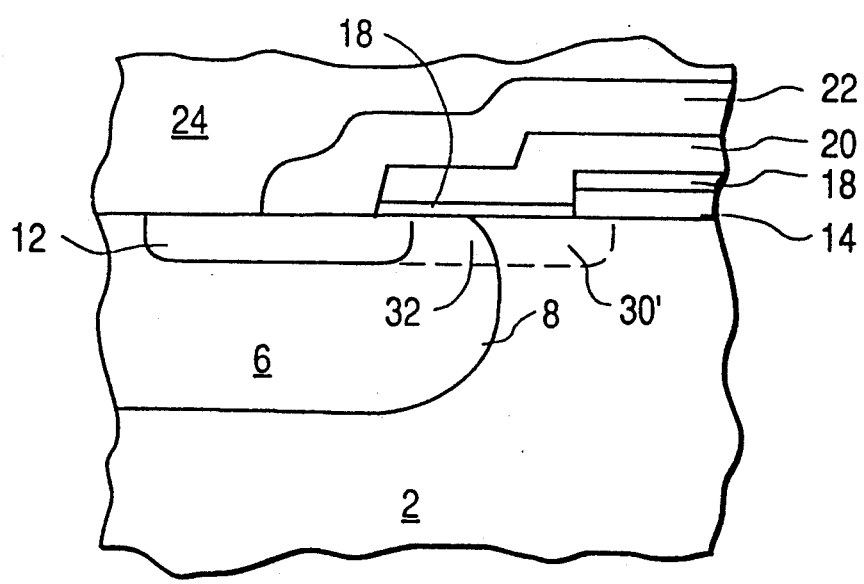

FIG. 3 illustrates an improved embodiment in which a reduction in avalanche breakdown voltage is avoided by limiting the lateral extent of the N conductivity implant so that it does not extend across the portions of body 2 which contact to substrate surface 4.

According to this embodiment, the first steps after forming epitaxial body region 2 include forming localized $SiO_2$ mask 14 essentially over the locations where body 2 is to extend to surface 4, and then performing the implant of N conductivity impurity over the remainder of surface 4. This will produce an impurity layer 30' having a higher impurity density than the remainder of body 2, and including regions 32 which correspond to channels 10 and which, after formation of P conductivity base region 6, will have a P conductivity with a lower impurity density than deeper portions of base region 6. With this arrangement, the impurity concentration in layer 30' can be made higher than that in layer 30 of FIG. 2 without adversely affecting the breakdown voltage of the device.

After the implantation of N conductivity layer 30', a second $SiO_2$ gate insulating layer 18 is formed, e.g. by oxidation. Then, polysilicon gate region 20 is deposited and used as a mask for implantation of P conductivity impurities to form base region 6. A further masking layer (not shown) is deposited, after which region 12 is formed by implantation, and the further masking layer is removed. Then, BPSG layer 22 and source metal layer 24 are deposited in the manner described above.

Figure 4:
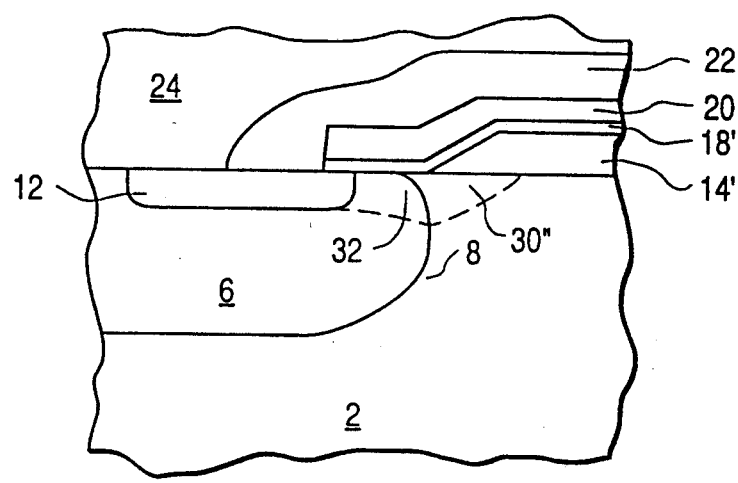
FIGS. 2, 3 and 4 are views similar to that of FIG. 1 illustrating three embodiments of the invention.

A final embodiment of the invention is shown in FIG. 4. For this embodiment, there is provided a first masking layer 14' having a tapered periphery. Such a taper is desirable because it allows the subsequently applied layers and the required photoresist layers to be of more uniform thickness. In the embodiment shown in FIG. 4, such tapering provides an improvement with respect to the dopant profile of N type implant layer 30''. When P conductivity impurity is diffused into the body surface to form base region 6, the concentration of this impurity decreases gradually in the lateral direction toward junction 8, i.e. this concentration tapers toward junction 8. The tapered edge of masking layer 14' gives the N conductivity impurity of layer 30'' a similar tapering concentration gradient in the direction parallel to surface 4 and this gradient lies in the same direction as the concentration taper, or gradient, of the implanted P conductivity body dopant impurity in channel 10 of base region 6. By appropriate matching of the edge taper of masking layer 14' to the P conductivity impurity diffusion gradient in region 32, a maximum threshold voltage reduction can be achieved with a minimum reduction of breakdown voltage.

Thus, in this embodiment, the concentration of N type impurity in region 32 can be increased still further.

The channel implant according to the invention enables the threshold voltage of such devices to be reduced while the influence of bipolar parasitic transistors is suppressed. Furthermore, the presence of the channel implant would permit the impurity concentration to be increased in deep portions of base region 6, thereby further suppressing bipolar parasitic transistor influence. Finally, the implant according to the invention has the effect of shortening the channel length and lowering the channel resistance and transistor on-resistance.

The shortening of the channel length is achieved, according to the invention, because the added impurity provided in layer 30, 30', or 30'' causes the junction 8, which is the boundary between regions having a net P conductivity and a net N conductivity, respectively, to bend toward region 12 near surface 4, as shown in FIGS. 2-4.

The shortening of channel length results in lowering of channel resistance. The added impurity provided by layer 30, 30', or 30'' in the body adjacent junction 8 helps to lower the transistor on-resistance.

Investigations to date have revealed that improvements of the type contemplated by the invention can be achieved, when base region 6 has a depth of 2-4 $\mu$, by implanting antimony or arsenic at a dose of $10^{12}$-$10^{13}$/cm$^2$ and then diffusing the impurity to a depth of the order of 1 $\mu$ to form layer 30, 30', or 30''.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. In a power FET composed of a substrate having upper and lower surfaces and having a semiconductor body of a first conductivity type, the body providing a current flow path between the upper and lower surfaces and having at least one body region which extends to said upper surface; and at least one base region extending into the substrate from the upper surface, the base region being of a second conductivity type opposite to the first conductivity type and having an upper portion located adjacent said upper surface of said substrate and a lower portion separated from said upper surface of said substrate by said upper portion, said base region meeting said body region at an interface which constitutes a pn junction, and said upper portion defining a channel which is disposed in the current flow path adjacent the upper surface of the substrate, and the FET further having an insulated gate disposed at the upper surface above the body region, the improvement comprising an impurity layer region extending into said channel from said upper surface of said substrate for giving said channel a lower carrier concentration than said lower portion of said base region, wherein: said impurity layer region also extends into a first part of said body region which is adjacent said pn junction and is absent from a second part of said body region which is spaced from said pn junction and underlies said insulated gate; said impurity layer is formed by introducing an impurity of the first conductivity type into said base region and said first part of said body region; and the concentration of the impurity of the first conductivity type in said first part of said body region decreases gradually in a direction away from said base region.

2. A power FET as defined in claim 1 wherein said base region is formed by introduction into said substrate of an impurity of the second conductivity type and the impurity of the second conductivity type has a concentration in said channel which decreases gradually a direction toward said body region.

3. A power FET as defined in claim 2 wherein the concentration of the impurity of the second conductivity type in said channel decreases in the same direction as the concentration of the impurity of the first conductivity type in said first part of said body region.

4. A power FET as defined in claim 1 wherein said insulated gate has a first insulating layer formed to have a tapered periphery at a location above said first part of said body region.

5. A power FET as defined in claim 4 wherein said base region is formed by introduction into said substrate of an impurity of the second conductivity type and the impurity of the second conductivity type has a concentration in said channel which decreases gradually a direction toward said body region.

6. A power FET as defined in claim 5 wherein the concentration of the impurity of the second conductivity type in said channel decreases in the same direction as the concentration of the impurity of the first conductivity type in said first part of said body region.

* * * * *